(12) United States Patent
Chang et al.

(10) Patent No.: US 11,058,020 B2
(45) Date of Patent: Jul. 6, 2021

(54) WALL MOUNT DEVICE

(71) Applicant: PEGATRON CORPORATION, Taipei (TW)

(72) Inventors: Ming-Han Chang, Taipei (TW); Chin-Yuan Chang, Taipei (TW); Ling-Chieh Kung, Taipei (TW); Yu-Shin Li, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 61 days.

(21) Appl. No.: 16/661,812

(22) Filed: Oct. 23, 2019

(65) Prior Publication Data
US 2020/0187372 A1 Jun. 11, 2020

(30) Foreign Application Priority Data

Dec. 11, 2018 (TW) ................................ 107144646

(51) Int. Cl.
*H02K 5/02* (2006.01)
*H05K 5/03* (2006.01)
*H02G 3/32* (2006.01)
*F16L 3/223* (2006.01)
*F16L 3/26* (2006.01)
(Continued)

(52) U.S. Cl.
CPC .......... *H05K 5/0247* (2013.01); *F16L 3/2235* (2013.01); *H02G 3/32* (2013.01); *H05K 5/0204* (2013.01); *H05K 5/03* (2013.01); *H05K 5/069* (2013.01)

(58) Field of Classification Search
CPC . F16L 3/2235; F16L 3/26; H02G 3/32; H05K 5/0204; H05K 5/069; H02K 3/10; H02K 3/2235; H02K 3/081
See application file for complete search history.

(56) References Cited

U.S. PATENT DOCUMENTS 5,569,882 A * 10/1996 Yokoyama ........... H02G 15/003
174/138 F
5,606,150 A * 2/1997 Radliff ................... H01R 4/646
174/92

(Continued)

FOREIGN PATENT DOCUMENTS

| TW | M285840 | 1/2006 |
|---|---|---|
| TW | M310560 | 4/2007 |
| TW | I629232 | 7/2018 |

*Primary Examiner* — Tan Le
(74) *Attorney, Agent, or Firm* — J.C. Patents (57) ABSTRACT

The present disclosure discloses a wall mount device adapted to be fixed to a wall surface and carry an electronic device with connecting wires. The wall mount device comprises a wall mount, a first and a second wire arrangement component. The wall mount has an upper and a lower surface. The upper surface faces the wall surface and the lower surface faces the electronic device. The first wire arrangement component is positioned on the lower surface and adjacent to a first side of the wall mount. The second wire arrangement component is positioned on the lower surface and adjacent to a second side vertical to the first side of the wall mount. The connecting wires are sequentially and detachably accommodated in the first and the second wire arrangement component from the electronic device to fix the connecting wires to corresponding positions on the wall mount.

9 Claims, 5 Drawing Sheets

(51) Int. Cl.
*H05K 5/02* (2006.01)
*H05K 5/06* (2006.01)

(56) References Cited

U.S. PATENT DOCUMENTS

| | | | | |
|---|---|---|---|---|
| 6,259,023 | B1 * | 7/2001 | Reiker | H01R 4/2433 174/502 |
| 7,311,828 | B2 * | 12/2007 | Miles | A47J 45/02 210/232 |
| 2004/0201975 | A1 * | 10/2004 | Bravo | H05K 7/1449 361/826 |
| 2006/0228087 | A1 * | 10/2006 | Bayazit | G02B 6/4452 385/135 |
| 2009/0016023 | A1 * | 1/2009 | Cao | F28D 15/0233 361/702 |

* cited by examiner

WALL MOUNT DEVICE

CROSS-REFERENCE TO RELATED APPLICATION

This application claims the priority benefit of Taiwan application serial no. 107144646, filed on Dec. 11, 2018. The entirety of the above-mentioned patent application is hereby incorporated by reference herein and made a part of this specification.

BACKGROUND

Technical Field

The present disclosure relates to a wall mount device, and more particularly to a wall mount device having a wire arrangement function.

Related Art

In most cases, in order to save space, users often use some mounted equipment in planning. Common examples are to set up a wall mount to hang the projector, audio, chandelier and other electronic devices on the ceiling. However, take the projector as an example, the external wires include at least a power supply wire, an HDMI transmission wire, a VGA wire, a video wire and a control wire. Since there are many wires connected to the electronic devices, it is easy to cause the wires to cross with each other, and it is often difficult for the user to insert the wires into the corresponding slots. In addition, the exposed wires are not only unsightly, but also may even cause security concerns.

Therefore, in order to avoid the above situation, it is a common practice to purchase an existing wire buckle to arrange the wires. However, commercially available wire buckles may not be able to match the position and structure of the wall mount. Users often need to envisage the way of configuring the conventional wire buckle. Even the wire buckle must be fixed together with the wires on the ceiling or the wall near the electronic device, so that the wires cannot be properly hidden. Not only does it cost more, but it also affects the overall look and convenience.

SUMMARY

The present disclosure provides a wall mount device which can simultaneously carry an electronic device and fix wires to avoid wire entanglement, and saves the money and labor costs of additional purchase and installation of wire arrangement equipment.

The wall mount device of the present disclosure is adapted to be fixed to a wall surface and carry an electronic device, and the electronic device comprises a plurality of connecting wires connected to the electronic device. The wall mount device comprises a wall mount, a first wire arrangement component and a second wire arrangement component. The wall mount has an upper surface and a lower surface opposite to the upper surface. The upper surface faces the wall surface and the lower surface faces the electronic device. The first wire arrangement component is positioned on the lower surface of the wall mount and adjacent to a first side of the wall mount. The second wire arrangement component is positioned on the lower surface of the wall mount and adjacent to a second side vertical to the first side of the wall mount. The connecting wires are sequentially and detachably accommodated in the first wire arrangement component and the second wire arrangement component from the electronic device to fix the connecting wires to corresponding positions on the wall mount.

Based on the above, the wall mount device of the present disclosure is provided with the first wire arrangement component and the second wire arrangement component on the lower surface of the wall mount toward the electronic device. The user can arrange the connecting wires connected to the electronic device on the first wire arrangement component and the second wire arrangement component to fix the connecting wires to the lower surface of the wall mount. That is to say, the wall mount device of the present disclosure skillfully utilizes the space between the electronic device and the wall mount to accommodate the messy connecting wires. In addition to carrying the electronic device, the wall mount device of the present disclosure has the function of concealing and tidying the messy connecting wires, and further solves the problem of the exposed wires. In addition, the wall mount device of the present disclosure saves the cost of additional purchase and installation of wire buckles, and also makes the installation easier and more convenient for the user.

In order to make the aforementioned characteristics and advantages of the present disclosure more comprehensible, embodiments accompanied with drawings are described in detail below.

DETAILED DESCRIPTION

For the abovementioned and other technical contents, characteristics and effects of the disclosure, preferable embodiments will be illustrated below with the accompanying drawings. The directional terms mentioned in the following embodiments, like "above", "below", "left", "right", "front" and "back", refer to the directions in the appended drawings. Therefore, the directional terms are used for illustration instead of limiting the present disclosure.

Figure 1:
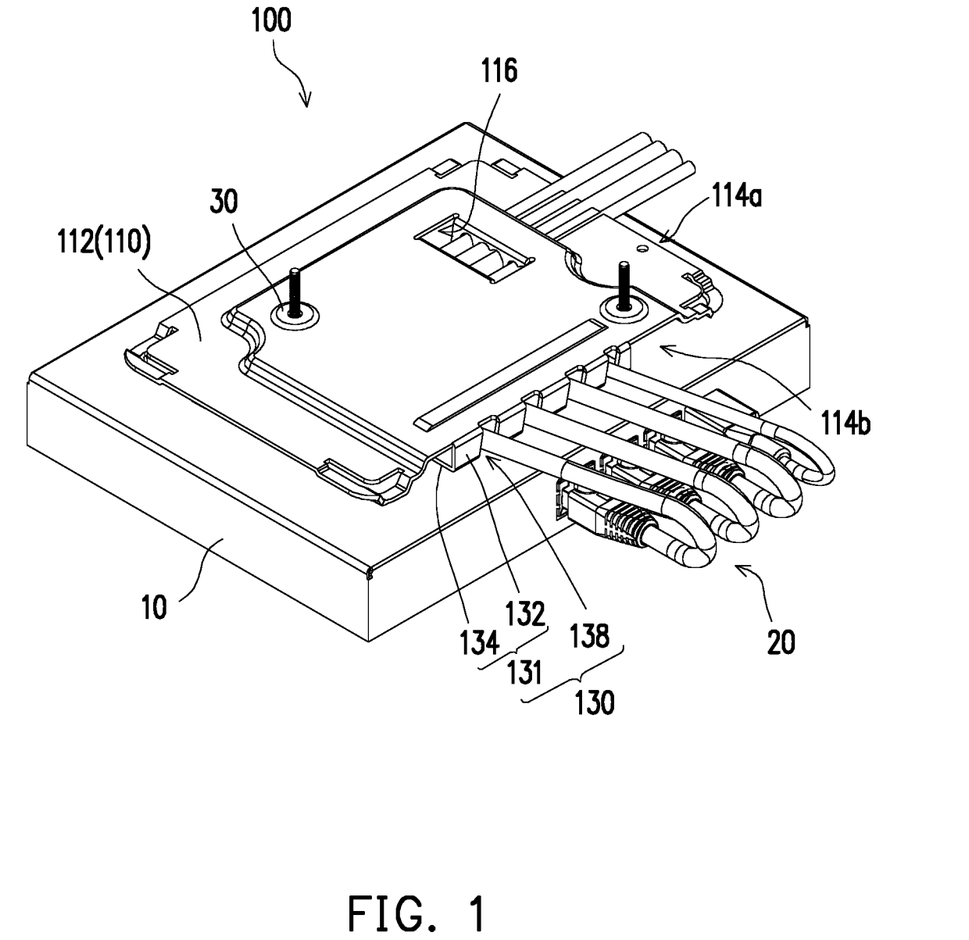
FIG. 1 is a schematic diagram of an electronic device and connecting wires arranged in a wall mount device according to an embodiment of the present disclosure.
Figure 2:
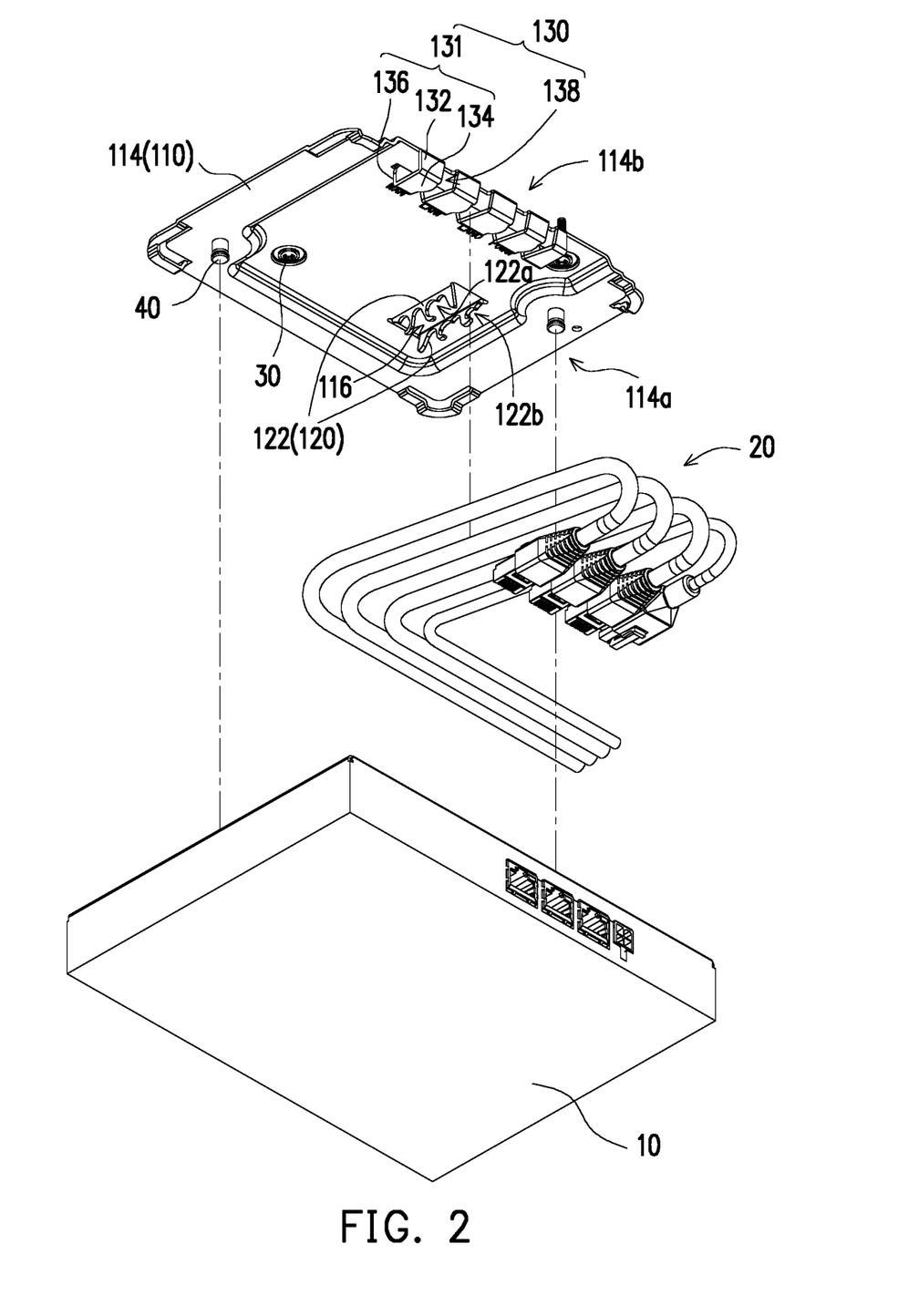
FIG. 2 is a schematic exploded diagram of FIG. 1.

FIG. 1 is a schematic diagram of an electronic device and connecting wires arranged in a wall mount device according to an embodiment of the present disclosure. FIG. 2 is a schematic exploded diagram of FIG. 1. Please refer to FIG. 1 and FIG. 2. In the present embodiment, a wall mount device 100 is adapted to be fixed to a wall surface (not shown) and carry an electronic device 10. In the present embodiment, the wall surface is, for example, a ceiling, but is not limited thereto. In other embodiments, the wall surface may also be a side wall or the like. It is to be noted that, in order to clearly express the relative relationship between the wall mount device 100, the electronic device 10, and the connecting wires 20, and in order to clearly illustrate the detailed configuration of the wall mount device 100, only the state in which the electronic device 10 and the connecting wires 20 are mounted on the wall mount device 100 is drawn, and the wall surface (ceiling) is not drawn, but the position of the wall surface is above the wall mount device 100 in FIGS. 1 and 2.

In the present embodiment, the wall mount 110 of the wall mount device 100 has an upper surface 112 (FIG. 1) and a lower surface 114 (FIG. 2) opposite to the upper surface 112. The upper surface 112 of the wall mount 110 is arranged facing the wall surface. The lower surface 114 of the wall mount 110 faces the electronic device 10.

In the present embodiment, the wall mount device 100 is fixed, for example, to the upper wall surface through a locking structure 30. In detail, the locking structure 30 passes from the upper surface 112 of the wall mount 110 through the wall mount 110 to the upper wall surface to fix the wall mount device 100 to the upper wall surface. The locking structure 30 is, for example, a screw, but the present embodiment is not limited thereto. Furthermore, from FIG. 2, the wall mount 110 includes a fixing structure 40 that protrudes from the lower surface 114. The user can detachably fix the electronic device 10 to the wall mount 110 by the fixing structure 40, so that the wall mount device 100 can hang the electronic device 10. In the present embodiment, the fixing structure 40 is, for example, a tack, a stud and a buckle. Of course, in other embodiments, it is not limited thereto, as long as the electronic device 10 can be detachably fixed.

As shown in FIG. 2, the wall mount 110 has a first side 114a and a second side 114b. In the present embodiment, the first side 114a is adjacent and vertical to the second side 114b, but the relation between the first side 114a and the second side 114b is not limited thereto. In other embodiments, the first side 114a may be opposite to the second side 114b.

In the present embodiment, the wall mount device 100 includes a first wire arrangement component 120. The first wire arrangement component 120 is arranged on the lower surface 114 of the wall mount 110 and adjacent to the first side 114a. In the present embodiment, the wall mount device 100 further includes a second wire arrangement component 130. The second wire arrangement component 130 is arranged on the lower surface 114 of the wall mount 110 and close to the second side 114b. It should be noted that, in the present embodiment, although the first wire arrangement component 120 and the second wire arrangement component 130 are illustrated, in other embodiments, the number and positions of the wire arrangement components are not limited thereto. For example, the wall mount device 100 may also have only the first wire arrangement component 120, or have more wire arrangement components.

In the present embodiment, the electronic device 10 can be connected to a commercial power source or other devices (for example, a user's computer) through connecting wires 20. The wall mount device 100 of the present embodiment not only can hang the electronic device 10 thereon, but also can neatly arrange the connecting wires 20 connected to the electronic device 10 and the commercial power source or other devices. In detail, the connecting wires 20 are sequentially and detachably accommodated in the first wire arrangement component 120 and the second wire arrangement component 130 from the electronic device 10 to fix the connecting wires 20 to corresponding positions on the wall mount 110, and make sure the connecting wires 20 are not entangled.

The positions of the first wire arrangement component 120 and the second wire arrangement component 130 can vary from product to product. For example, in the present embodiment, the position of the first wire arrangement component 120 can be close to the electronic device 10, so that the connecting wires 20 can be limited by the first wire arrangement component 120 at a position close to the electronic device 10. The second wire arrangement component 130 can be positioned close to a user end such that the portion of the connecting wires 20 close to the commercial power source or other devices can be limited by the second wire arrangement component 130. Of course, in other embodiments, the relationship between the positions of the first wire arrangement component 120 and the second wire arrangement component 130 and the external devices is not limited thereto. Moreover, in other embodiments, the configuration and design of the connecting wires 20 may vary depending on the type of the electronic device 10, and the disclosure is not limited thereto.

Figure 3:
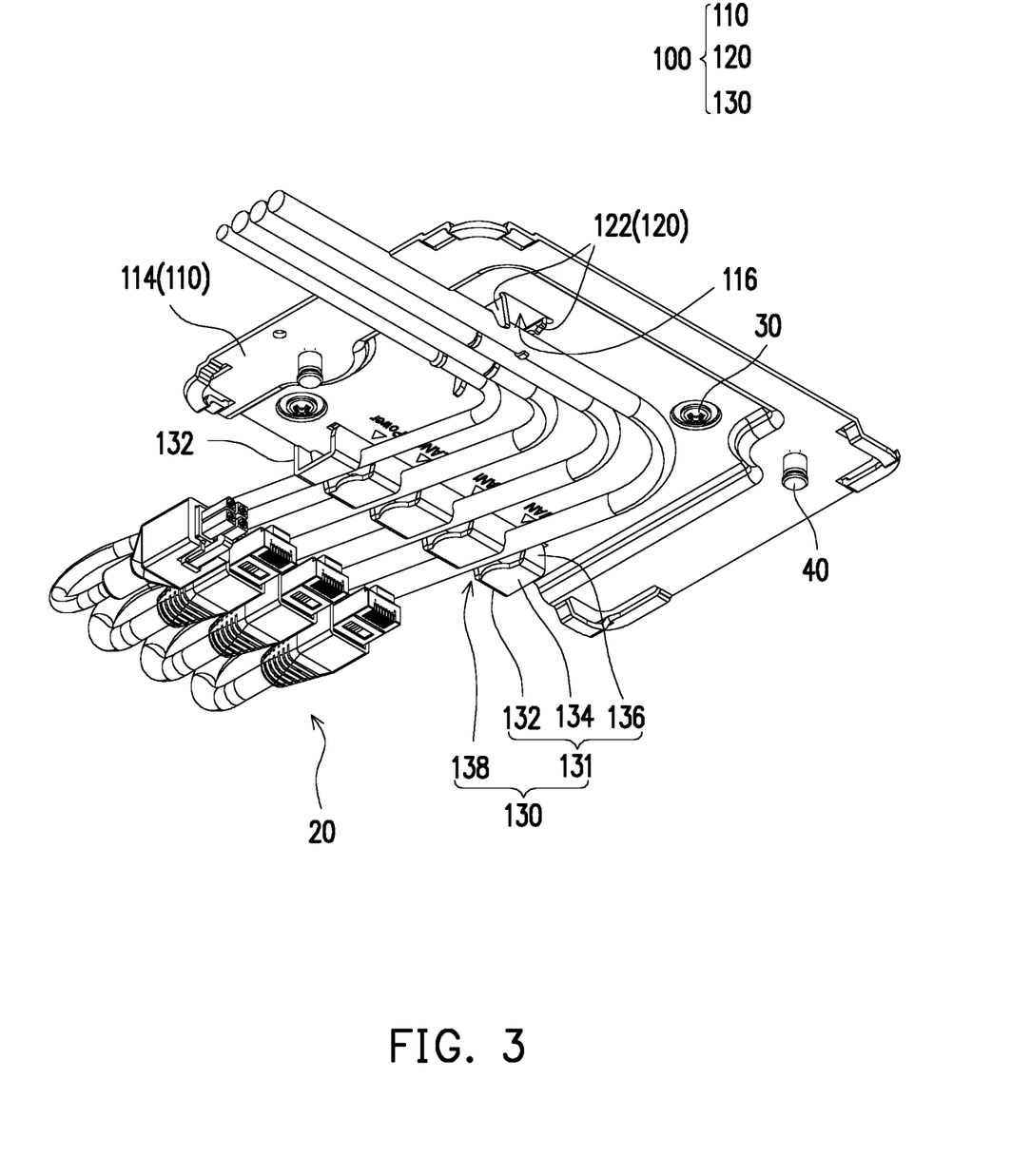
FIG. 3 is a schematic diagram of the wall mount device in which the connecting wires are arranged in the perspective of FIG. 2.

FIG. 3 is a schematic diagram of a wall mount device in which the connecting wires are arranged in the perspective of FIG. 2. As shown in FIG. 3, in the present embodiment, since the first side 114a is adjacent to the second side 114b, when the connecting wires 20 are accommodated by the first wire arrangement component 120 and the second wire arrangement component 130, the connecting wires 20 between the first wire arrangement component 120 and the second wire arrangement component 130 are correspondingly turned and bent, and the lower surface 114 of the wall mount 110 leaves space without interfering with the connecting wires 20 at this portion.

It should be noted that, in the present embodiment, since the first wire arrangement component 120 and the second wire arrangement component 130 are positioned on the lower surface 114 of the wall mount 110, most of the connecting wires 20 are positioned between the electronic device 10 and the wall mount device 100. That is, the wall mount device 100 of the present embodiment can properly hide the connecting wires 20 in the space between the electronic device 10 and the wall mount 110. As a result, the conventional problem that hanging the electronic device often causes a large area of the wires to be exposed is solved.

Figure 4:
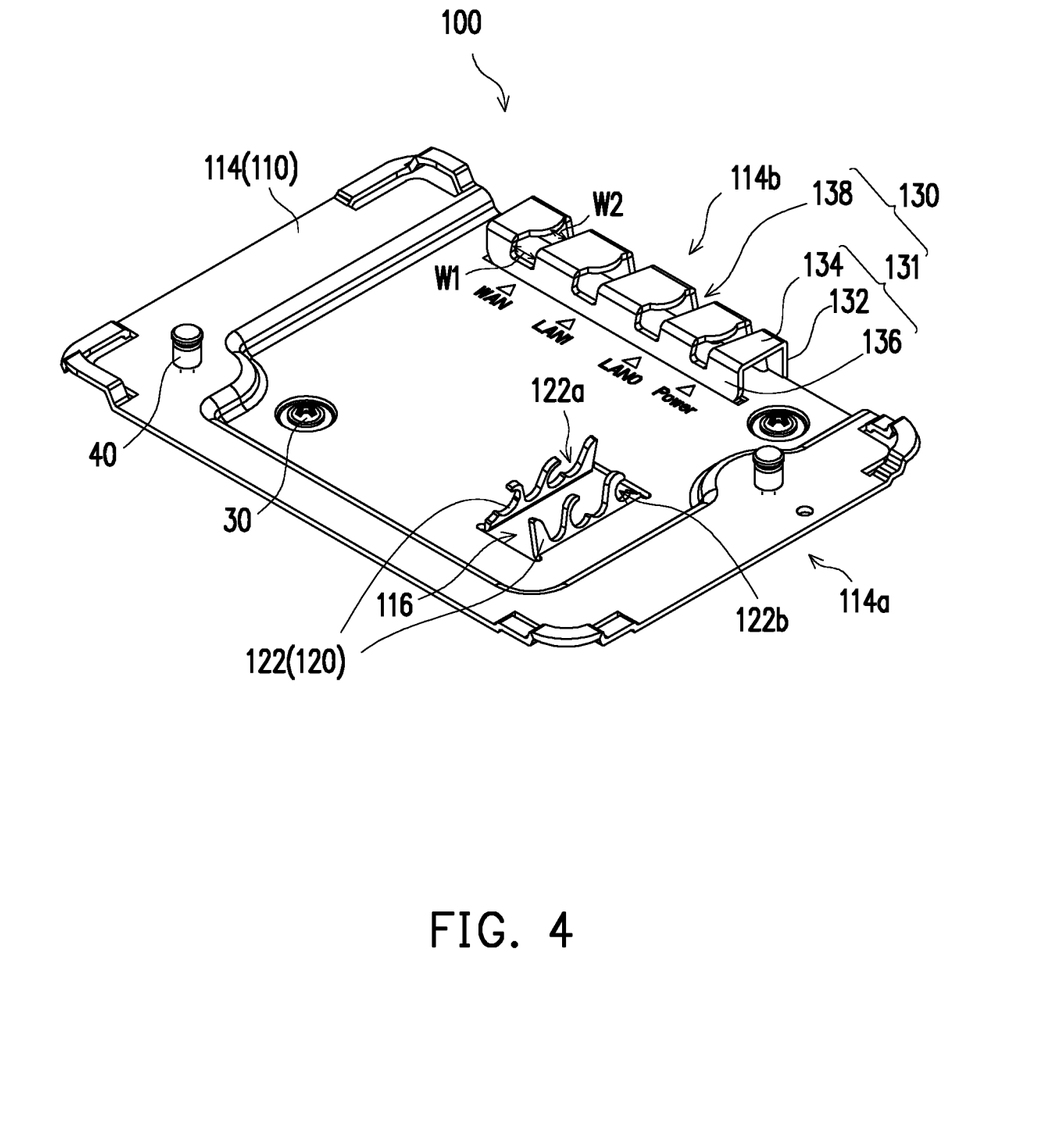
FIGS. 4 and 5 are stereoscopic diagrams of the wall mount device of FIG. 1 from different perspectives respectively.
Figure 5:
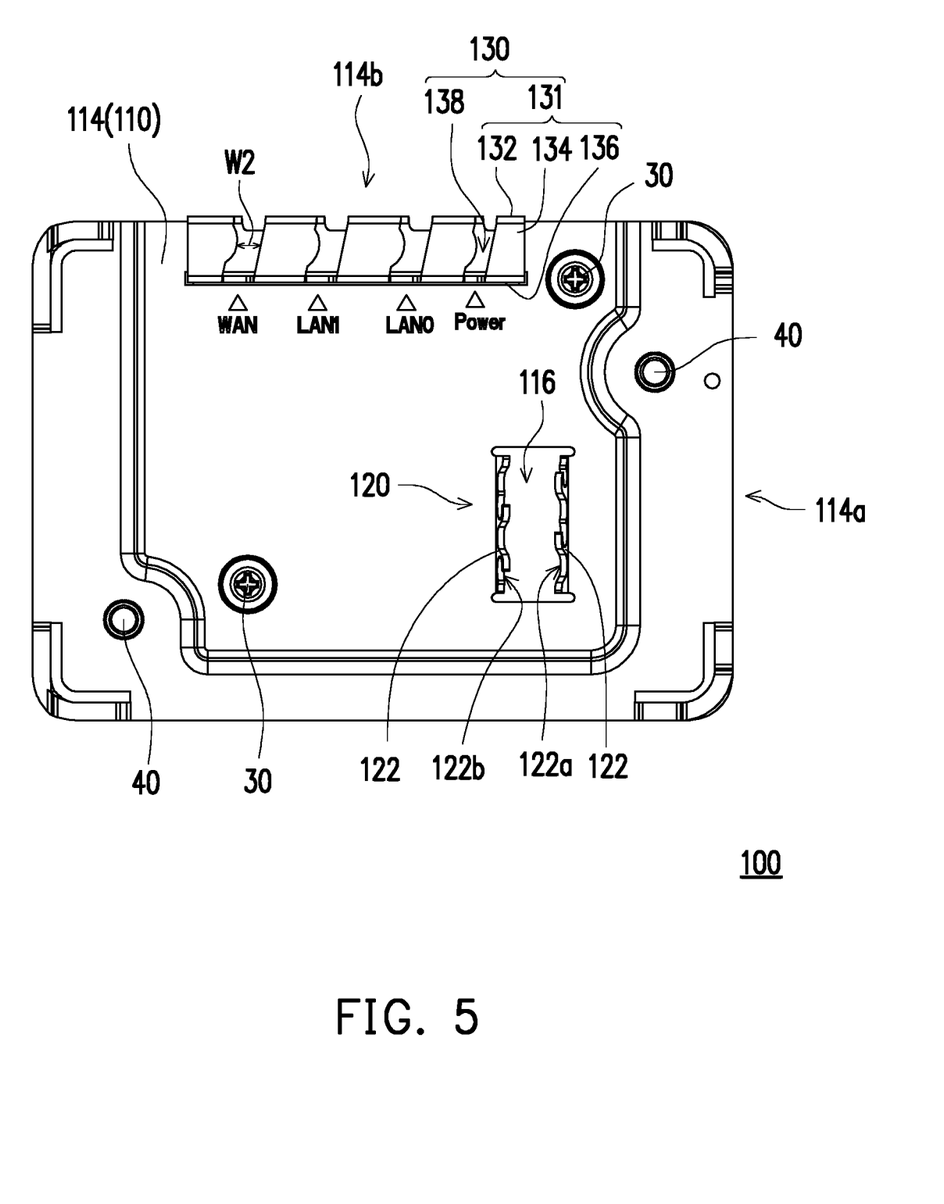

FIGS. 4 and 5 are stereoscopic diagrams of the wall mount device of FIG. 1 from different perspectives respectively. Please refer to FIG. 4 and FIG. 5. It must be noted that in order to clearly express the detailed structural features of the wall mount 110 of the wall mount device 100 in the present embodiment, the wall mount device 100 in FIGS. 4 and 5 is drawn in a form in which the lower surface 114 faces upward. That is, the perspectives of FIGS. 4 and 5 are viewed from the lower sides of FIGS. 1 and 2.

Please refer to FIG. 3, FIG. 4 and FIG. 5. In the present embodiment, the material of the wall mount 110 is, for example, a metal piece. Of course, in other embodiments, the wall mount 110 can also use other materials, and is not limited thereto. In the present embodiment, the first wire arrangement component 120 is integrally formed with the wall mount 110. In detail, the wall mount 110 includes an internal hole 116 and two side blocks 122 on both sides of the internal hole 116, and the two side blocks 122 are bent away from the upper surface 112 of the wall mount 110 to form the first wire arrangement component 120 that rises from the lower surface 114.

For example, the first wire arrangement component 120 can be formed by stamping the metal sheet to form the internal hole 116 by a stamping process, and the two side blocks 122 on both sides of the internal hole 116 are bent to form the first wire arrangement component 120 of the present embodiment. Of course, in other embodiments, the wall mount 110 and the first wire arrangement component 120 may also be two separated parts fixed together, and are not limited to a single structure.

The two side blocks 122 of the first wire arrangement component 120 respectively include at least one group of opposite two notches 122a and 122b. In the present embodiment, for example, four groups are provided, but the number of the groups of the two notches 122a and 122b is not limited thereto. From FIG. 4, in the present embodiment, each of the two notches 122a and 122b of the two side blocks 122 forms a structure similar to double hooks, and each group of the two notches 122a and 122b can accommodate and temporarily fix the same connecting line 20. In the present embodiment, the opening directions of the corresponding two notches 122a and 122b in each group are different. The connecting wires 20 are inserted or taken out from different directions when being inserted into or taken out from the two notches 122a and 122b. Therefore, the two side blocks 122 can provide limit for the connecting wires 20 in different directions near the two notches 122a and 122b of each group, and have better fixation. In addition, in the two notches 122a and 122b of each group, one notch 122a has a groove shape, and the other notch 122b is formed by an opening with a hook. The hook is adapted to fix a corresponding connecting wire 20 to prevent the corresponding connecting wire 20 from slipping off. Of course, in other embodiments, the shapes of the notches 122a and 122b and the opening directions of the notches 122a and 122b are not limited thereto.

In addition, please refer to FIG. 3 and FIG. 4, in the groups of the opposite two notches 122a and 122b of the present embodiment, a size of one group of the two notches 122a and 122b may be different from a size of another group of two notches 122a and 122b. From FIG. 3, due to the difference in thickness of the connecting wires 20, the size of the group of two notches 122a and 122b for fixing thicker connecting wires 20 may be larger than the size of the group of two notches 122a and 122b for fixing thinner connecting wires 20. Therefore, the groups of the two notches 122a and 122b of the first wire arrangement component 120 of the present embodiment can accommodate the connecting wires 20 of various thicknesses. Therefore, the wall mount device 100 of the present embodiment is preferably adapted to provide a good fixing effect for the different types of connecting wires 20.

Referring to FIG. 3, FIG. 4 and FIG. 5, in the present embodiment, the second wire arrangement component 130 of the wall mount device 100 includes at least two sets of fixing components 131 and at least one slot 138, and each of the fixing components 131 includes a first section 132, a second section 134 and a third section 136. In detail, the first section 132 extends from the second side 114b of the wall mount 110 and extends away from the upper surface 112 of the wall mount 110. The second section 134 is connected to the first section 132 and the third section 136 in a bending manner. The third section 136 is connected to the second section 134 and the lower surface 114 of the wall mount 110. At least one slot 138 is formed between any two adjacent fixing components 131, and each slot 138 is used for accommodating and temporarily fixing the corresponding connecting wire 20.

For example, as shown in FIG. 3 and FIG. 4, in the present embodiment, a number of the at least one slot 138 is, for example, four. The four slots 138 of the second wire arrangement component 130, for example, respectively fasten the four connecting wires 20 to be inserted into the WAN slot, the LAN1 slot, the LAN0 slot and the Power slot of the electronic device 10. Of course, the number of slots 138 and the type of the connecting wires 20 to be fixed are not limited thereto. In the present embodiment, the configuration of the slots 138 indirectly assists the user in how to properly manage the connecting wires 20 to prevent the connecting wires 20 from being entangled. In addition, it is convenient for the user to set the connecting wires 20 on the second wire arrangement component 130 according to the type indication on the second wire arrangement component 130.

In addition, in the present embodiment, as shown in FIG. 4, the portion of the slot 138 of the second wire arrangement component 130 corresponding to the first section 132 and the third section 136 has a first width W1. The portion of the slot 138 of the second wire arrangement component corresponding to the second section 134 has a second width W2. The first width W1 is larger than the second width W2.

Referring to FIG. 3, in the present embodiment, since the first width W1 is slightly larger than the outer diameter of the corresponding connecting wire 20, the user can conveniently insert the corresponding connecting wire 20 into the slot 138. The second width W2 is slightly smaller than the outer diameter of the corresponding connecting wire 20 such that the connecting wire 20 that has been stuck into the slot 138 can be restrained by the second section 134 without easily coming out of the slot 138. This also ensures that when the wall mount 110 of the present embodiment is hung on the ceiling, the connecting wire 20 can be stably fixed by the wall mount device 100 without falling off.

It is worth mentioning that in other embodiments, the relative relationship between the first width W1, the second width W2 and the outer diameter of the connecting wire 20 is not limited thereto, and can be properly configured according to different needs of the user. In addition, in the present embodiment, the plurality of slots 138 of the second wire arrangement component 130 have different sizes. In other words, various types of connecting wires 20 with different thicknesses can be detachably arranged in the slots 138 of the second wire arrangement component 130. For example, as shown in FIG. 5, the size of the leftmost slot 138 of the second wire arrangement component 130 is larger than the size of the rightmost slot. Of course, in other embodiments, the size of the slots 138 is not limited thereto.

Based on the above, the wall mount device of the present disclosure is provided with the first wire arrangement component and the second wire arrangement component on the lower surface of the wall mount toward the electronic device to fix the connecting wires connected to the electronic device. In addition, the wall mount device of the present disclosure skillfully utilizes the space between the electronic device and the wall mount to accommodate and arrange the messy connecting wires. Therefore, the wall mount device of the present disclosure has a function of carrying the electronic device, is capable of concealing and tidying messy connecting wires, solves the problem of messy exposed wires, and saves the cost and time of additional purchase and installation of wire buckles for the users.

Although the present disclosure has been disclosed above in the embodiments, it is not intended to limit the present disclosure. Anyone of ordinary skill in the art can make some changes and refinements without departing from the spirit and scope of the present disclosure. Therefore, the scope of protection of the present disclosure is subject to the definition of the scope of the appended claims.

What is claimed is:

1. A wall mount device, adapted to be fixed to a wall surface and carry an electronic device, wherein the electronic device comprises a plurality of connecting wires, and the wall mount device comprises:

a wall mount, having an upper surface and a lower surface opposite to the upper surface and comprising an internal hole and two side blocks on both sides of the internal hole, wherein the two side blocks respectively comprise at least a group of opposite two notches, and the upper surface faces the wall surface and the lower surface faces the electronic device;

a first wire arrangement component, positioned on the lower surface of the wall mount and adjacent to a first side of the wall mount, wherein the first wire arrangement component is formed by bending the two side blocks away from the upper surface to rise from the lower surface; and a second wire arrangement component, positioned on the lower surface of the wall mount and adjacent to a second side vertical to the first side of the wall mount, wherein the connecting wires are sequentially and respectively detachably accommodated in corresponding two notches and the second wire arrangement component from the electronic device to fix the connecting wires to corresponding positions on the wall mount.

2. The wall mount device as in claim 1, wherein the first wire arrangement component is integrally formed on the wall mount.

3. The wall mount device as in claim 1, wherein opening directions of the two notches are different in each group.

4. The wall mount device as in claim 1, wherein in the two notches of each group, one of the notches has a groove shape, the other notch is formed by an opening with a hook, and the hook is adapted to fix a corresponding connecting wire to prevent the corresponding connecting wire from slipping off.

5. The wall mount device as in claim 1, wherein the at least one group of opposite two notches include a plurality of groups of opposite two notches, and the size of the two notches in one group is different from the size of the two notches in another group.

6. The wall mount device as in claim 1, wherein the second wire arrangement component comprises at least two fixing elements and at least one slot between any two adjacent fixing elements, each of the fixing elements comprises a first section, a second section and a third section, wherein the first section extending from the second side of the wall mount and extending away from the upper surface, the second section connected to the first section in a bending manner, and the third section connected to the second section and the lower surface, and the connecting wires are respectively accommodated in the slots correspondingly.

7. The wall mount device as in claim 6, wherein a size of the at least one slot corresponding to the first section and the third section is greater than a size of the at least one slot corresponding to the second section.

8. The wall mount device as in claim 1, wherein the wall mount comprises a through hole and a locking structure corresponding to the through hole, and the locking structure passes through the wall mount from the lower surface of the wall mount to the wall surface to fix the wall mount device to the wall surface.

9. The wall mount device as in claim 1, wherein the wall mount comprises a fixing structure for detachably fixing the electronic device to the wall mount.

* * * * *